(12) United States Patent
Bravard et al.

(10) Patent No.: US 10,088,174 B2
(45) Date of Patent: *Oct. 2, 2018

(54) MULTIPLE HEATSINK COOLING SYSTEM FOR A LINE VOLTAGE THERMOSTAT

(71) Applicant: Honeywell International Inc., Morris Plains, NJ (US)

(72) Inventors: Lionel Bravard, Montreal (CA); Daniel Landry, St-Hyaciinthe (CA); Daniel Tousignant, St-Jean-sur-Richelieu (CA); Evelyne Tremblay, Chambly (CA); Joel McNabb-Baltar, Montreal (CA)

(73) Assignee: Honeywell International Inc., Morris Plains, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/624,673

(22) Filed: Jun. 15, 2017

(65) Prior Publication Data
US 2017/0307231 A1   Oct. 26, 2017

Related U.S. Application Data

(63) Continuation of application No. 14/329,357, filed on Jul. 11, 2014, now Pat. No. 9,683,749.

(51) Int. Cl.
*H05B 1/02* (2006.01)
*F24D 19/10* (2006.01)
(Continued)

(52) U.S. Cl.
CPC .......... *F24D 19/1096* (2013.01); *F28F 13/00* (2013.01); *G05D 23/1902* (2013.01);
(Continued)

(58) Field of Classification Search
CPC ............ F24D 19/1096; G05D 23/1902; G05D 23/20; H05B 1/02; H05B 1/0275; H05B 1/0202
(Continued)

(56) References Cited

U.S. PATENT DOCUMENTS 3,464,673 A   9/1969   Cargo et al.
3,665,159 A   5/1972   Becker et al.
(Continued)

FOREIGN PATENT DOCUMENTS

CA   1035448 A    7/1978
DE   3334117 A1   4/1985
(Continued)

OTHER PUBLICATIONS

Gentex Corporation, 9000 Series, Photoelectric Type Single Station/Multi-Station Smoke Alarms AC Powered With Battery Backup, Installation Instructions—Owner's Information, pp. 9-1 to 9-6, Jan. 1, 1993.

(Continued)

*Primary Examiner* — Mark Paschall
(74) *Attorney, Agent, or Firm* — Seager Tufte & Wickhem LLP

(57) ABSTRACT

A line voltage thermostat having a multiple heatsink switch. A total switch may have a semiconductor switch mounted on each heatsink of the multiple heatsink switch. The semiconductor switches of the respective heatsinks may be connected in parallel to represent the total switch. Each of the two or more heatsinks, having a semiconductor switch for switching, and in total conveying the same power as one equivalent switch with one total heatsink, may have higher maximum operating temperatures and higher thermal resistances than twice the thermal resistance of the one total heatsink. The two or more heatsinks may be situated within a housing of the line voltage thermostat, and be easier to (Continued)

distribute in the housing to achieve an efficient layout of a display and control buttons for the thermostat.

20 Claims, 7 Drawing Sheets

(51) Int. Cl.
    *G05D 23/20*     (2006.01)
    *G05D 23/19*     (2006.01)
    *F28F 13/00*     (2006.01)
    *H05K 7/20*     (2006.01)

(52) U.S. Cl.
    CPC ............... *G05D 23/20* (2013.01); *H05B 1/02* (2013.01); *H05B 1/0202* (2013.01); *H05B 1/0275* (2013.01); *H05K 7/2039* (2013.01)

(58) Field of Classification Search
    USPC .................... 219/494, 497, 501, 506–510
    See application file for complete search history.

(56) References Cited

U.S. PATENT DOCUMENTS

| | | |
|---|---|---|
| 3,899,713 A | 8/1975 | Barkan et al. |
| 3,942,028 A | 3/1976 | Baker |
| 4,078,720 A | 3/1978 | Nurnberg |
| 4,079,366 A | 3/1978 | Wong |
| 4,093,943 A | 6/1978 | Knight |
| 4,151,387 A | 4/1979 | Peters, Jr. |
| 4,174,807 A | 11/1979 | Smith et al. |
| 4,197,571 A | 4/1980 | Grunert |
| 4,206,872 A | 6/1980 | Levine |
| 4,224,615 A | 9/1980 | Penz |
| 4,232,819 A | 11/1980 | Bost |
| 4,257,555 A | 3/1981 | Neel |
| 4,264,034 A | 4/1981 | Hyltin et al. |
| 4,274,045 A | 6/1981 | Goldstein |
| 4,296,334 A | 10/1981 | Wong |
| 4,298,946 A | 11/1981 | Hartsell et al. |
| 4,300,199 A | 11/1981 | Yoknis et al. |
| 4,308,991 A | 1/1982 | Peinetti et al. |
| 4,316,256 A | 2/1982 | Hendricks et al. |
| 4,332,352 A | 6/1982 | Jaeger |
| 4,337,822 A | 7/1982 | Hyltin et al. |
| 4,337,893 A | 7/1982 | Flanders et al. |
| 4,373,664 A | 2/1983 | Barker et al. |
| 4,379,483 A | 4/1983 | Farley |
| 4,382,544 A | 5/1983 | Stewart |
| 4,384,213 A | 5/1983 | Bogel |
| 4,386,649 A | 6/1983 | Hines et al. |
| 4,388,692 A | 6/1983 | Jones et al. |
| 4,431,134 A | 2/1984 | Hendricks et al. |
| 4,446,913 A | 5/1984 | Krocker |
| 4,479,604 A | 10/1984 | Didner |
| 4,503,471 A | 3/1985 | Hanajima et al. |
| 4,504,778 A | 3/1985 | Evans |
| 4,506,827 A | 3/1985 | Jamieson et al. |
| 4,556,169 A | 12/1985 | Zervos |
| 4,585,164 A | 4/1986 | Butkovich et al. |
| 4,606,401 A | 8/1986 | Levine et al. |
| 4,621,336 A | 11/1986 | Brown |
| 4,622,544 A | 11/1986 | Bially et al. |
| 4,628,201 A | 12/1986 | Schmitt |
| 4,641,013 A | 2/1987 | Dunnigan et al. |
| 4,646,964 A | 3/1987 | Parker et al. |
| 4,692,596 A | 9/1987 | Payne |
| 4,706,177 A | 11/1987 | Josephson |
| 4,717,333 A | 1/1988 | Carignan |
| 4,725,001 A | 2/1988 | Carney et al. |
| 4,745,300 A | 5/1988 | Kammerer et al. |
| 4,745,311 A | 5/1988 | Iwasaki |
| 4,806,843 A | 2/1989 | Mertens et al. |
| 4,811,163 A | 3/1989 | Fletcher |
| 4,829,779 A | 5/1989 | Munson et al. |
| 4,881,686 A | 11/1989 | Mehta |
| 4,918,439 A | 4/1990 | Wozniak et al. |
| 4,939,995 A | 7/1990 | Feinberg |
| 4,942,613 A | 7/1990 | Lynch |
| 4,948,040 A | 8/1990 | Kobayashi et al. |
| 4,969,508 A | 11/1990 | Tate et al. |
| 4,992,779 A | 2/1991 | Sugino et al. |
| 4,997,029 A | 3/1991 | Otsuka et al. |
| 5,005,365 A | 4/1991 | Lynch |
| 5,012,973 A | 5/1991 | Dick et al. |
| 5,025,134 A | 6/1991 | Bensoussan et al. |
| 5,036,698 A | 8/1991 | Conti |
| 5,038,851 A | 8/1991 | Mehta |
| 5,053,752 A | 10/1991 | Epstein et al. |
| 5,065,813 A | 11/1991 | Berkeley et al. |
| 5,081,411 A | 1/1992 | Walker |
| 5,086,385 A | 2/1992 | Launey et al. |
| 5,088,645 A | 2/1992 | Bell |
| 5,118,963 A | 6/1992 | Gesin |
| 5,120,983 A | 6/1992 | Samann |
| 5,140,310 A | 8/1992 | DeLuca et al. |
| 5,161,606 A | 11/1992 | Berkeley et al. |
| 5,170,935 A | 12/1992 | Federspiel et al. |
| 5,172,565 A | 12/1992 | Wruck et al. |
| 5,181,653 A | 1/1993 | Foster et al. |
| 5,187,797 A | 2/1993 | Nielsen et al. |
| 5,192,874 A | 3/1993 | Adams |
| 5,210,685 A | 5/1993 | Rosa |
| 5,221,877 A | 6/1993 | Falk |
| 5,226,591 A | 7/1993 | Ratz |
| 5,230,482 A | 7/1993 | Ratz et al. |
| 5,238,184 A | 8/1993 | Adams |
| 5,251,813 A | 10/1993 | Kniepkamp |
| 5,259,445 A | 11/1993 | Pratt et al. |
| 5,272,477 A | 12/1993 | Tashima et al. |
| 5,277,244 A | 1/1994 | Mehta |
| 5,289,047 A | 2/1994 | Broghammer |
| 5,294,849 A | 3/1994 | Potter |
| 5,329,991 A | 7/1994 | Mehta et al. |
| 5,348,078 A | 9/1994 | Dushane et al. |
| 5,351,035 A | 9/1994 | Chrisco |
| 5,361,009 A | 11/1994 | Lu |
| 5,386,577 A | 1/1995 | Zenda |
| 5,390,206 A | 2/1995 | Rein et al. |
| 5,404,934 A | 4/1995 | Carlson et al. |
| 5,414,618 A | 5/1995 | Mock et al. |
| 5,429,649 A | 7/1995 | Robin |
| 5,439,441 A | 8/1995 | Grimsley et al. |
| 5,452,197 A | 9/1995 | Rice |
| 5,482,209 A | 1/1996 | Cochran et al. |
| 5,495,887 A | 3/1996 | Kathnelson et al. |
| 5,502,618 A | 3/1996 | Chiou |
| 5,506,572 A | 4/1996 | Hills et al. |
| 5,526,422 A | 6/1996 | Keen |
| 5,537,026 A * | 7/1996 | Estes .................... G05F 1/66 323/239 |
| 5,537,106 A | 7/1996 | Mitsuhashi |
| 5,544,036 A | 8/1996 | Brown, Jr. et al. |
| 5,566,879 A | 10/1996 | Longtin |
| 5,570,837 A | 11/1996 | Brown et al. |
| 5,579,197 A | 11/1996 | Mengelt et al. |
| 5,590,831 A | 1/1997 | Manson et al. |
| 5,603,451 A | 2/1997 | Helander et al. |
| 5,654,813 A | 8/1997 | Whitworth |
| 5,668,535 A | 9/1997 | Hendrix et al. |
| 5,671,083 A | 9/1997 | Connor et al. |
| 5,673,850 A | 10/1997 | Uptegraph |
| 5,679,137 A | 10/1997 | Erdman et al. |
| 5,682,206 A | 10/1997 | Wehmeyer et al. |
| 5,711,785 A | 1/1998 | Maxwell |
| 5,732,691 A | 3/1998 | Maiello et al. |
| 5,736,795 A | 4/1998 | Zuehlke et al. |
| 5,761,083 A | 6/1998 | Brown, Jr. et al. |
| 5,782,296 A | 7/1998 | Mehta |
| 5,801,940 A | 9/1998 | Russ et al. |
| 5,810,908 A | 9/1998 | Gray et al. |
| 5,818,428 A | 10/1998 | Eisenbrandt et al. |
| 5,833,134 A | 11/1998 | Ho et al. |
| 5,839,654 A | 11/1998 | Weber |

(56) References Cited

U.S. PATENT DOCUMENTS

| | | |
|---|---|---|
| 5,840,094 A | 11/1998 | Osendorf et al. |
| 5,862,737 A | 1/1999 | Chin et al. |
| 5,873,519 A | 2/1999 | Beilfuss |
| 5,886,697 A | 3/1999 | Naughton et al. |
| 5,899,866 A | 5/1999 | Cyrus et al. |
| 5,902,183 A | 5/1999 | D'Souza |
| 5,903,139 A | 5/1999 | Kompelien |
| 5,909,429 A | 6/1999 | Satyanarayana et al. |
| 5,915,473 A | 6/1999 | Ganesh et al. |
| 5,917,141 A | 6/1999 | Naquin, Jr. |
| 5,917,416 A | 6/1999 | Read |
| D413,328 S | 8/1999 | Kazama |
| 5,937,942 A | 8/1999 | Bias et al. |
| 5,947,372 A | 9/1999 | Tiernan |
| 5,950,709 A | 9/1999 | Krueger et al. |
| 6,009,355 A | 12/1999 | Obradovich et al. |
| 6,013,121 A | 1/2000 | Chiu et al. |
| 6,018,700 A | 1/2000 | Edel |
| 6,020,881 A | 2/2000 | Naughton et al. |
| 6,032,867 A | 3/2000 | Dushane et al. |
| D422,594 S | 4/2000 | Henderson et al. |
| 6,059,195 A | 5/2000 | Adams et al. |
| 6,081,197 A | 6/2000 | Garrick et al. |
| 6,084,523 A | 7/2000 | Gelnovatch et al. |
| 6,089,221 A | 7/2000 | Mano et al. |
| 6,101,824 A | 8/2000 | Meyer et al. |
| 6,104,963 A | 8/2000 | Cebasek et al. |
| 6,119,125 A | 9/2000 | Gloudeman et al. |
| 6,121,875 A | 9/2000 | Hamm et al. |
| 6,140,987 A | 10/2000 | Stein et al. |
| 6,141,595 A | 10/2000 | Gloudeman et al. |
| 6,145,751 A | 11/2000 | Ahmed |
| 6,149,065 A | 11/2000 | White et al. |
| 6,152,375 A | 11/2000 | Robison |
| 6,154,081 A | 11/2000 | Pakkala et al. |
| 6,167,316 A | 12/2000 | Gloudeman et al. |
| 6,190,442 B1 | 2/2001 | Redner |
| 6,192,282 B1 | 2/2001 | Smith et al. |
| 6,196,467 B1 | 3/2001 | Dushane et al. |
| 6,205,041 B1 | 3/2001 | Baker |
| 6,208,331 B1 | 3/2001 | Singh et al. |
| 6,216,956 B1 | 4/2001 | Ehlers et al. |
| 6,236,326 B1 | 5/2001 | Murphy |
| 6,259,074 B1 | 7/2001 | Brunner et al. |
| 6,260,765 B1 | 7/2001 | Natale et al. |
| 6,285,912 B1 | 9/2001 | Ellison et al. |
| 6,288,458 B1 | 9/2001 | Berndt |
| 6,290,140 B1 | 9/2001 | Pesko et al. |
| D448,757 S | 10/2001 | Okubo |
| 6,315,211 B1 | 11/2001 | Sartain et al. |
| 6,318,639 B1 | 11/2001 | Toth |
| 6,321,637 B1 | 11/2001 | Shanks et al. |
| 6,330,806 B1 | 12/2001 | Beaverson et al. |
| 6,344,861 B1 | 2/2002 | Naughton et al. |
| 6,351,693 B1 | 2/2002 | Monie et al. |
| 6,356,038 B2 | 3/2002 | Bishel |
| 6,385,510 B1 | 5/2002 | Hoog et al. |
| 6,394,359 B1 | 5/2002 | Morgan |
| 6,397,612 B1 | 6/2002 | Kernkamp et al. |
| 6,398,118 B1 | 6/2002 | Rosen et al. |
| 6,448,896 B1 | 9/2002 | Bankus et al. |
| 6,449,726 B1 | 9/2002 | Smith |
| 6,453,687 B2 | 9/2002 | Sharood et al. |
| D464,948 S | 10/2002 | Vasquez et al. |
| 6,460,774 B2 | 10/2002 | Sumida et al. |
| 6,466,132 B1 | 10/2002 | Caronna et al. |
| 6,478,233 B1 | 11/2002 | Shah |
| 6,490,174 B1 | 12/2002 | Kompelien |
| 6,502,758 B2 | 1/2003 | Cottrell |
| 6,507,282 B1 | 1/2003 | Sherwood |
| 6,512,209 B1* | 1/2003 | Yano ............... G05D 23/1919 219/494 |
| 6,518,953 B1 | 2/2003 | Armstrong |
| 6,518,957 B1 | 2/2003 | Lehtinen et al. |
| 6,546,419 B1 | 4/2003 | Humpleman et al. |
| 6,556,899 B1 | 4/2003 | Harvey et al. |
| 6,566,768 B2 | 5/2003 | Zimmerman et al. |
| 6,574,537 B2 | 6/2003 | Kipersztok et al. |
| 6,578,770 B1 | 6/2003 | Rosen |
| 6,580,950 B1 | 6/2003 | Johnson et al. |
| 6,581,846 B1 | 6/2003 | Rosen |
| 6,587,739 B1 | 7/2003 | Abrams et al. |
| 6,595,430 B1 | 7/2003 | Shah |
| 6,596,059 B1 | 7/2003 | Greist et al. |
| D478,051 S | 8/2003 | Sagawa |
| 6,608,560 B2 | 8/2003 | Abrams |
| 6,619,055 B1 | 9/2003 | Addy |
| 6,619,555 B2 | 9/2003 | Rosen |
| 6,621,507 B1 | 9/2003 | Shah |
| 6,622,925 B2 | 9/2003 | Carner et al. |
| 6,635,054 B2 | 10/2003 | Fjield et al. |
| 6,663,010 B2 | 12/2003 | Chene et al. |
| 6,685,098 B2 | 2/2004 | Okano et al. |
| 6,702,811 B2 | 3/2004 | Stewart et al. |
| 6,726,112 B1 | 4/2004 | Ho |
| D492,282 S | 6/2004 | Lachello et al. |
| 6,771,996 B2 | 8/2004 | Bowe et al. |
| 6,783,079 B2 | 8/2004 | Carey et al. |
| 6,786,421 B2 | 9/2004 | Rosen |
| 6,789,739 B2 | 9/2004 | Rosen |
| 6,801,849 B2 | 10/2004 | Szukala et al. |
| 6,808,524 B2 | 10/2004 | Lopath et al. |
| 6,810,307 B1 | 10/2004 | Addy |
| 6,810,397 B1 | 10/2004 | Qian et al. |
| 6,824,069 B2 | 11/2004 | Rosen |
| 6,833,990 B2 | 12/2004 | LaCroix et al. |
| 6,842,721 B2 | 1/2005 | Kim et al. |
| 6,851,621 B1 | 2/2005 | Wacker et al. |
| 6,868,293 B1 | 3/2005 | Schurr et al. |
| 6,893,438 B2 | 5/2005 | Hall et al. |
| 6,934,862 B2 | 8/2005 | Sharood et al. |
| D512,208 S | 12/2005 | Kubo et al. |
| 6,973,410 B2 | 12/2005 | Seigel |
| 7,001,495 B2 | 2/2006 | Essalik et al. |
| D520,989 S | 5/2006 | Miller |
| 7,050,026 B1 | 5/2006 | Rosen |
| 7,055,759 B2 | 6/2006 | Wacker et al. |
| 7,080,358 B2 | 7/2006 | Kuzmin |
| 7,083,109 B2 | 8/2006 | Pouchak |
| 7,083,189 B2 | 8/2006 | Ogata |
| 7,084,774 B2 | 8/2006 | Martinez |
| 7,089,088 B2 | 8/2006 | Terry et al. |
| 7,108,194 B1 | 9/2006 | Hankins, II |
| 7,119,431 B1 | 10/2006 | Hopper et al. |
| 7,130,719 B2 | 10/2006 | Ehlers et al. |
| D531,588 S | 11/2006 | Peh |
| 7,133,748 B2 | 11/2006 | Robinson |
| D533,515 S | 12/2006 | Klein et al. |
| 7,146,253 B2 | 12/2006 | Hoog et al. |
| 7,152,806 B1 | 12/2006 | Rosen |
| 7,156,318 B1 | 1/2007 | Rosen |
| 7,163,156 B2 | 1/2007 | Kates |
| 7,188,002 B2 | 3/2007 | Chapman, Jr. et al. |
| D542,236 S | 5/2007 | Klein et al. |
| 7,212,887 B2 | 5/2007 | Shah et al. |
| 7,222,800 B2 | 5/2007 | Wruck et al. |
| 7,225,054 B2 | 5/2007 | Amundson et al. |
| 7,231,605 B1 | 6/2007 | Ramakasavan |
| 7,232,075 B1 | 6/2007 | Rosen |
| 7,240,289 B2 | 7/2007 | Naughton et al. |
| 7,244,294 B2 | 7/2007 | Kates |
| 7,261,762 B2 | 8/2007 | Kang et al. |
| 7,263,283 B2 | 8/2007 | Knepler |
| 7,274,973 B2 | 9/2007 | Nichols et al. |
| 7,302,642 B2 | 11/2007 | Smith et al. |
| 7,331,187 B2 | 2/2008 | Kates |
| 7,341,201 B2 | 3/2008 | Stanimirovic |
| 7,354,005 B2 | 4/2008 | Carey et al. |
| RE40,437 E | 7/2008 | Rosen |
| 7,419,532 B2 | 9/2008 | Sellers et al. |
| 7,435,278 B2 | 10/2008 | Terlson |
| 7,451,606 B2 | 11/2008 | Harrod |
| 7,452,396 B2 | 11/2008 | Terlson et al. |
| 7,476,988 B2 | 1/2009 | Mulhouse et al. |

(56) References Cited

U.S. PATENT DOCUMENTS

| | | |
|---|---|---|
| 7,489,094 B2 | 2/2009 | Steiner et al. |
| 7,496,627 B2 | 2/2009 | Moorer et al. |
| 7,500,026 B2 | 3/2009 | Fukanaga et al. |
| 7,505,914 B2 | 3/2009 | McCall |
| 7,542,867 B2 | 6/2009 | Steger et al. |
| 7,556,207 B2 | 7/2009 | Mueller et al. |
| 7,574,283 B2 | 8/2009 | Wang et al. |
| 7,584,897 B2 | 9/2009 | Schultz et al. |
| 7,594,960 B2 | 9/2009 | Johansson |
| 7,595,613 B2 | 9/2009 | Thompson et al. |
| 7,600,694 B2 | 10/2009 | Helt et al. |
| 7,604,046 B2 | 10/2009 | Bergman et al. |
| 7,617,691 B2 | 11/2009 | Street et al. |
| 7,642,674 B2 | 1/2010 | Mulhouse et al. |
| 7,644,591 B2 | 1/2010 | Singh et al. |
| 7,665,019 B2 | 2/2010 | Jaeger |
| 7,676,282 B2 | 3/2010 | Bosley |
| 7,692,559 B2 | 4/2010 | Face et al. |
| 7,707,189 B2 | 4/2010 | Haselden et al. |
| 7,713,339 B2 | 5/2010 | Johansson |
| 7,739,282 B1 | 6/2010 | Smith et al. |
| 7,755,220 B2 | 7/2010 | Sorg et al. |
| 7,770,242 B2 | 8/2010 | Sell |
| 7,793,056 B2 | 9/2010 | Boggs et al. |
| 7,814,516 B2 | 10/2010 | Stecyk et al. |
| 7,837,676 B2 | 11/2010 | Sinelnikov et al. |
| 7,838,803 B1 | 11/2010 | Rosen |
| 7,859,815 B2 | 12/2010 | Black et al. |
| 7,865,252 B2 | 1/2011 | Clayton |
| 7,941,431 B2 | 5/2011 | Bluhm et al. |
| 7,952,485 B2 | 5/2011 | Schecter et al. |
| 7,956,719 B2 | 6/2011 | Anderson, Jr. et al. |
| 7,957,775 B2 | 6/2011 | Allen, Jr. et al. |
| 7,984,220 B2 | 7/2011 | Gerard et al. |
| 7,992,764 B2 | 8/2011 | Magnusson |
| 7,992,794 B2 | 8/2011 | Leen et al. |
| 8,032,254 B2 | 10/2011 | Amundson et al. |
| 8,060,470 B2 | 11/2011 | Davidson et al. |
| 8,087,593 B2 | 1/2012 | Leen |
| 8,091,796 B2 | 1/2012 | Amundson et al. |
| 8,138,634 B2 | 3/2012 | Ewing et al. |
| 8,167,216 B2 | 5/2012 | Schultz et al. |
| 8,216,216 B2 | 7/2012 | Warnking et al. |
| 8,219,249 B2 | 7/2012 | Harrod et al. |
| 8,239,066 B2 | 8/2012 | Jennings et al. |
| 8,276,829 B2 | 10/2012 | Stoner et al. |
| 8,280,556 B2 | 10/2012 | Besore et al. |
| 8,314,517 B2 | 11/2012 | Simard et al. |
| 8,346,396 B2 | 1/2013 | Amundson et al. |
| 8,417,091 B2 | 4/2013 | Kim et al. |
| 8,437,878 B2 | 5/2013 | Grohman et al. |
| 8,511,577 B2 | 8/2013 | Warren et al. |
| 8,532,190 B2 | 9/2013 | Shimizu et al. |
| 8,554,374 B2 | 10/2013 | Lunacek et al. |
| 8,574,343 B2 | 11/2013 | Bisson et al. |
| 8,613,792 B2 | 12/2013 | Ragland et al. |
| 8,623,117 B2 | 1/2014 | Zavodny et al. |
| 8,629,661 B2 | 1/2014 | Shimada et al. |
| 8,680,442 B2 | 3/2014 | Reusche et al. |
| 8,704,672 B2 | 4/2014 | Hoglund et al. |
| 8,731,723 B2 | 5/2014 | Boll et al. |
| 8,734,565 B2 | 5/2014 | Hoglund et al. |
| 8,752,771 B2 | 6/2014 | Warren et al. |
| 8,768,341 B2 | 7/2014 | Coutelou et al. |
| 8,881,172 B2 | 11/2014 | Schneider |
| 8,886,179 B2 | 11/2014 | Pathuri et al. |
| 8,886,314 B2 | 11/2014 | Crutchfield et al. |
| 8,892,223 B2 | 11/2014 | Leen et al. |
| 8,902,071 B2 | 12/2014 | Barton et al. |
| 9,002,523 B2 | 4/2015 | Erickson et al. |
| 9,071,145 B2 | 6/2015 | Simard et al. |
| 9,080,784 B2 | 7/2015 | Dean-Hendricks et al. |
| 9,098,279 B2 | 8/2015 | Mucignat et al. |
| 9,206,993 B2 | 12/2015 | Barton et al. |
| 9,234,677 B2 * | 1/2016 | Clade .......... F24H 3/0405 |
| 9,234,877 B2 | 1/2016 | Hattersley et al. |
| 9,261,287 B2 | 2/2016 | Warren et al. |
| 9,272,647 B2 | 3/2016 | Gawade et al. |
| 9,366,448 B2 | 6/2016 | Dean-Hendricks et al. |
| 9,374,268 B2 | 6/2016 | Budde et al. |
| 9,419,602 B2 | 8/2016 | Tousignant et al. |
| 9,628,074 B2 | 4/2017 | Tousignant et al. |
| 9,683,749 B2 * | 6/2017 | Bravard .......... F24D 19/1096 |
| 2001/0029585 A1 | 10/2001 | Simon et al. |
| 2001/0052459 A1 | 12/2001 | Essalik et al. |
| 2002/0011923 A1 | 1/2002 | Cunningham et al. |
| 2002/0022991 A1 | 2/2002 | Sharood et al. |
| 2002/0023916 A1 | 2/2002 | Geiger et al. |
| 2002/0082746 A1 | 6/2002 | Schubring et al. |
| 2002/0092779 A1 | 7/2002 | Essalik et al. |
| 2002/0181251 A1 | 12/2002 | Kompelien |
| 2003/0033230 A1 | 2/2003 | McCall |
| 2003/0034897 A1 | 2/2003 | Shamoon et al. |
| 2003/0034898 A1 | 2/2003 | Shamoon et al. |
| 2003/0040279 A1 | 2/2003 | Ballweg |
| 2003/0060821 A1 | 3/2003 | Hall et al. |
| 2003/0073891 A1 | 4/2003 | Chen et al. |
| 2003/0103075 A1 | 6/2003 | Rosselot |
| 2003/0177012 A1 | 9/2003 | Drennan |
| 2004/0262410 A1 | 12/2004 | Hull |
| 2005/0083168 A1 | 4/2005 | Breitenbach |
| 2005/0270151 A1 | 12/2005 | Winick |
| 2006/0052905 A1 | 3/2006 | Pfingsten et al. |
| 2006/0112700 A1 | 6/2006 | Choi et al. |
| 2006/0196953 A1 | 9/2006 | Simon et al. |
| 2006/0242591 A1 | 10/2006 | Van Dok et al. |
| 2007/0013534 A1 | 1/2007 | DiMaggio |
| 2007/0045429 A1 | 3/2007 | Chapman, Jr. et al. |
| 2007/0114293 A1 | 5/2007 | Gugenheim |
| 2007/0114295 A1 | 5/2007 | Jenkins et al. |
| 2007/0114848 A1 | 5/2007 | Mulhouse et al. |
| 2007/0115135 A1 | 5/2007 | Mulhouse et al. |
| 2007/0119961 A1 | 5/2007 | Kaiser |
| 2007/0163844 A1 | 7/2007 | Jahkonen |
| 2007/0241203 A1 | 10/2007 | Wagner et al. |
| 2007/0277061 A1 | 11/2007 | Ashe |
| 2007/0289731 A1 | 12/2007 | Deligiannis et al. |
| 2007/0290924 A1 | 12/2007 | McCoy |
| 2007/0296260 A1 | 12/2007 | Stossel |
| 2008/0015740 A1 | 1/2008 | Osann |
| 2009/0143880 A1 | 6/2009 | Amundson et al. |
| 2009/0154206 A1 | 6/2009 | Fouquet et al. |
| 2009/0165644 A1 | 7/2009 | Campbell |
| 2009/0167265 A1 | 7/2009 | Vanderzon |
| 2009/0206657 A1 | 8/2009 | Vuk et al. |
| 2010/0026379 A1 | 2/2010 | Simard et al. |
| 2010/0084482 A1 | 4/2010 | Kennedy et al. |
| 2010/0204834 A1 | 8/2010 | Comerford et al. |
| 2010/0225267 A1 | 9/2010 | Elhalis |
| 2010/0314458 A1 | 12/2010 | Votaw et al. |
| 2011/0073101 A1 | 3/2011 | Lau et al. |
| 2011/0185895 A1 | 8/2011 | Freen |
| 2012/0235490 A1 | 9/2012 | Lee et al. |
| 2012/0323377 A1 | 12/2012 | Hoglund et al. |
| 2013/0158714 A1 | 6/2013 | Barton et al. |
| 2013/0158715 A1 | 6/2013 | Barton et al. |
| 2013/0158717 A1 | 6/2013 | Zywicki et al. |
| 2013/0158718 A1 | 6/2013 | Barton et al. |
| 2013/0158720 A1 | 6/2013 | Zywicki et al. |
| 2013/0213952 A1 | 8/2013 | Boutin et al. |
| 2013/0238142 A1 | 9/2013 | Nichols et al. |
| 2013/0245838 A1 | 9/2013 | Zywicki et al. |
| 2013/0261807 A1 | 10/2013 | Zywicki et al. |
| 2013/0308362 A1 | 11/2013 | Karlsson et al. |
| 2014/0062672 A1 | 3/2014 | Gudan et al. |
| 2014/0312131 A1 | 10/2014 | Tousignant et al. |
| 2014/0312696 A1 | 10/2014 | Tousignant et al. |
| 2014/0312697 A1 | 10/2014 | Landry et al. |
| 2015/0001929 A1 | 1/2015 | Juntunen et al. |
| 2015/0001930 A1 | 1/2015 | Juntunen et al. |
| 2015/0002165 A1 | 1/2015 | Juntunen |
| 2015/0115045 A1 | 4/2015 | Tu et al. |

(56) References Cited

U.S. PATENT DOCUMENTS

| | | | |
|---|---|---|---|
| 2015/0144706 A1 | 5/2015 | Robideau et al. | |
| 2015/0145347 A1 | 5/2015 | Kim et al. | |
| 2015/0370265 A1 | 12/2015 | Ren et al. | |

FOREIGN PATENT DOCUMENTS

| | | |
|---|---|---|
| EP | 0070414 A1 | 1/1983 |
| EP | 0434926 B1 | 8/1995 |
| EP | 0678204 B1 | 3/2000 |
| EP | 0985994 A1 | 3/2000 |
| EP | 1033641 A1 | 9/2000 |
| EP | 1143232 A1 | 10/2001 |
| EP | 1074009 B1 | 3/2002 |
| EP | 2138919 A1 | 12/2009 |
| FR | 2491692 A1 | 4/1982 |
| FR | 2711230 A1 | 4/1995 |
| WO | 9711448 A1 | 3/1997 |
| WO | 9739392 A1 | 10/1997 |
| WO | 0043870 A2 | 7/2000 |
| WO | 0152515 A1 | 7/2001 |
| WO | 0179952 A1 | 10/2001 |
| WO | 0223744 A2 | 3/2002 |
| WO | 2010021700 A1 | 2/2010 |

OTHER PUBLICATIONS

Harris et al., "Optimizing Memory Transactions," Microsoft Research Havard University, 12 pages, May 25, 2012.
Honeywell Brivis Deluxe Programmable Thermostat, pp. 1-20, 2002.
Honeywell Brivis T8602C Chronotherm IV Deluxe Programmable Thermostats, Installation Instructions, pp. 1-12, 2002.
Honeywell CT8602C Professional Fuel Saver Thermostat, pp. 1-6, 1995.
Honeywell Electronic Programmable Thermostat, Owner's Guide, pp. 1-20, 2003.
Honeywell Electronic Programmable Thermostats, Installation Instructions, pp. 1-8, 2003.
Honeywell News Release, "Honeywell's New Sysnet Facilities Integration System for Boiler Plant and Combustion Safety Processes," 4 pages, Dec. 15, 1995.
Honeywell T8002 Programmable Thermostat, Installation Instructions, pp. 1-8, 2002.
Honeywell T8602A,B,C,D and TS8602A,C Chronotherm III Fuel Saver Thermostats, Installation Instructions, pp. 1-12, 1995.
Honeywell T8602D Chronotherm IV Deluxe Programmable Thermostats, Installation Instructions, pp. 1-12, 2002.
Honeywell TH8000 Series Programmable Thermostats, Owner's Guide, pp. 1-44, 2004.
Honeywell, "Excel Building Supervisor-Integrated R7044 and FS90 Ver. 2.0," Operator Manual, 70 pages, Apr. 1995.
Honeywell, "Installation Guide: Wireless Entry/Exit Remote," 12 pages, 2011.
Honeywell, "Introduction of the S7350A Honeywell WebPAD Information Appliance," Home and Building Control Bulletin, 2 pages, Aug. 29, 2000; Picture of WebPad Device with touch screen, 1 Page; and screen shots of WebPAD Device, 4 pages.
Honeywell, "RedLINK™ Wireless Comfort Systems," RedLINK Wireless Technology, 8 pages, Aug. 2011.
Honeywell, "Total Connect Online Help Guide," Revision A, 800-02577-TC, Mar. 2010.
Honeywell, "Total Connect User Guide," Revision B, 34 pages, May 15, 2012.
Honeywell, "VisionPRO® 8000 Thermostats," downloaded from http://yourhome.honeywell.com, 2 pages, May 24, 2012.
Honeywell, "W7006A Home Controller Gateway User Guide," 31 pages, Jul. 2001.
Honeywell, MagicStat® CT3200 Programmable Thermostat, Installation and Programming Instructions, pp. 1-24, 2001.
Honeywell, Wireless Entry/Exit Remote, Operating Manual, 9 pages, 2011.
http://hunter-thermostats.com/hunter_programmable_thermostats.html, Hunter Thermostat 44668 Specifications, and 44758 Specifications, 2 pages, Printed Jul. 13, 2011.
http://www.cc.gatech.edu/computing/classes/cs6751_94_fall/groupc/climate-2/node1.html, "Contents," 53 pages, printed Sep. 20, 2004.
http://www.ritetemp.info/rtMenu_13.html, Rite Temp 8082, 6 page, printed Jun. 20, 2003.
http://www.thermostatsales.com, Robertshaw, "9610 Digital Programmable Thermostat," 3 pages, printed Jun. 17, 2004.
http://www.thermostatsales.com, Robertshaw, "9700 Deluxe Programmable Thermostat" 3 pages, printed Jun. 17, 2004.
http://www.thermostatsales.com, Robertshaw, "9710 Deluxe Programmable Thermostat," 3 pages, printed Jun. 17, 2004.
http://www.thermostatsales.com, Robertshaw, "9720 Deluxe Programmable Thermostat,"3 pages, printed Jun. 17, 2004.
Hunter, "44200/44250," Owner's Manual, 32 pages, prior to Jul. 7, 2004.
Hunter, "44300/44350,"Owner's Manual, 35 pages, prior to Jul. 7, 2004.
Hunter, "Auto Saver 550", Owner's Manual Model 44550, 44 pages, prior to Jul. 7, 2004.
Hunter, "Model 44758 Remote Sensor,"Owner's Manual, 2 pages, Revision Sep. 4, 2008.
Install Guide for Ritetemp Thermostat 8082, 6 pages, 2002.
Invensys™, "9700i 9701i 9715i 9720i Deluxe Programmable Thermostats,"User's Manual, pp.1-28, prior to Jul. 7, 2004.
Inventek, "Inventek Systems, ISM4319-M3X-L44-X Embedded Serial-to-Wi-Fi Module eS-WiFi 802.11 b/g/n Data Sheet", ,Inventek, "Inventek Systems, ISM4319-M3X-L44-X Embedded Serial-to-Wi-Fi Module eS-WiFi 802.11 b/g/n Data Sheet", accessed from http://www.inventeksys.com/wp-content/uplo . . . Feb. 6, 2012.
Larsson, "Battery Supervision in Telephone Exchanges,"Ericsson Components AB Sweden, 5 pages, Downloaded May 5, 2012.
Lennox, "Network Control Panel (NCP)," User's Manual, 18 pages, Nov. 1999.
Lennox, "Prodigy Control System," Lennox Industries, 4 pages, May 25, 2012.
Logitech, "Harmony 880 Remote User Manual," v. 1, pp. 1-15, prior to Nov. 30, 2007.
Lux ELV1 Programmable Line Voltage Thermostat, Installation Instructions, 3 pages, prior to Jul. 7, 2004.
Lux TX500 Series Smart Temp Electronic Thermostat, 3 pages, prior to Jul. 7, 2004.
Lux TX9000 Installation, 3 pages, prior to Apr. 21, 2005.
Lux, "9000RF Remote Instructions," 2 pages, prior to Nov. 30, 2007.
Lux, "511 Series Smart Temp Electronic Thermostat," Owner's Manual, 3 pages, prior to Jul. 7, 2004.
Lux, "600 Series Smart Temp Electronic Thermostat," Owner's Manual, 3 pages, prior to Jul. 7, 2004.
Lux, "602 Series Multi-Stage Programmable Thermostat," Owner's Manual, 2 pages, prior to Jul. 7, 2004.
Lux, "605/2110 Series Programmable Heat Pump Thermostat," Owner's Manual, 3 pages, prior to Jul. 7, 2004.
Lux, "700/9000 Series Smart Temp Electronic Thermostat," Owner's Manual, 3 pages, prior to Jul. 7, 2004.
Lux, "PSPH521 Series Programmable Heat Pump Thermostat," Owner's Manual, 3 pages, prior to Jul. 7, 2004.
White-Rodgers, Comfort-Set 90 Series Premium, 4 pages, prior to Apr. 21, 2005.
www.icmcontrols.com, Simplecomfort, SC3000 Single Stage Heat/Single Stage Cool or Single Stage Heat Pump/Manual Changeover, 1 page, prior to Jul. 7, 2004.
www.icmcontrols.com, Simplecomfort, SC3001 Single Stage Heat/Single Stage Cool or Single Stage Heat Pump/Manual Changeover, 1 page, prior to Jul. 7, 2004.
www.icmcontrols.com, Simplecomfort, SC3006 Single Stage Heat/Single Stage Cool or Single Stage Heat Pump/Manual Changeover, 1 page, prior to Jul. 7, 2004.
www.icmcontrols.com, Simplecomfort, SC3201 2 Stage Heat Pump Manual Changeover, 1 page, prior to Jul. 7, 2004.

(56) References Cited

OTHER PUBLICATIONS www.icmcontrols.com, Simplecomfort, SC3801 2 Stage Heat/2 Stage Cool 2 Stage Heat Pump/Audio Changeover, 1 page, prior to Jul. 7, 2004.
Cirrus Logic, Inc., "CS1501 Digital Power Factor Correction Control IC," 16 pages, 2012.
International Search Report for Corresponding Application No. PCT/US2014/044229, dated Oct. 13, 2014.
U.S. Appl. No. 14/300,232, filed Jun. 9, 2014.
Hendon Semiconductors, "OM1894 Dual Sensing Precision Triac Control," Product Specification, Rev. 2.0, 21 pages, Apr. 19, 2007.
Honeywell, "System Installation Guide: Important Instructions," Honeywell International Inc., 25 pages, 2011.
http://www.dimplex.com/en/home_heating/linear_convector_baseboards/products/lpc_series/linear_proportional_convector, Dimplex Coporation, "Linear Convector LPC Series," 2 pages, May 2011.
http://www.enernetcorp.com/, Enernet Corporation, "Wireless Temperature Control" 1 page, 2011.
http://www.enernetcorp.com/t9000-wireless-thermostat.html, Enernet Corporation, "T9000 Series Wireless Fan Coil Thermostat," Product Brochure, 2 pages, 2011.
http://www.enocean-alliance.org/en/products/regulvar_rw-ssr347-15a/, Regulvar Corporation, "RW-SSR347-15A, Relais sans fil à semi-conducteurs" 3 pages, Aug. 8, 2009.
http://www.enocean-alliance.org/en/products/regulvar_rw-tp01/, Regulvar Corporation, "RW-TP01, Capteur de température sans fil" 3 pages, Aug. 9, 2009.
http://www.forwardthinking.honeywell.com/products/wireless/focus_pro/focus_pro_feature_html, Honeywell corporation, "Wireless FocusPRO® pages", 2 pages, 2011.
Signetics Linear Products, "TDA1024 Zero Crossing Triac Trigger," Product Specification, 14 pages, Sep. 1985.
"RCS X10 Thermostat Plug-in for HomeSeer Beta Version 2.0.105," 25 pages, prior to Sep. 7, 2011.
"CorAccess Systems/In Home," http://web.archive.org/web20011212084427/www.coraccess.com/home.html, 1 pages, copyright 2001, printed Aug. 19, 2004.
"HAI Company Background," http://www.homeauto.com/AboutHAI/abouthai_main.htm, 2 pages, printed Aug. 19, 2004.
"High-tech options take hold in new homes—200-08-28—Dallas Business Journal," http://bizjournals.com/dallas/stories/2000/08/28/focus4, 3 pages, dated Aug. 28, 2000, printed Aug. 19, 2004.
"Home Toys Review—Touch Linc", http://www.hometoys.com/htinews/aug99/reviews/touchlinc/touchlinc.htm, 3 pages, dated Aug. 1999, printed Aug. 20, 2004.
"HTI News Release," http://www.hometoys.com/htinews/apr99/releases/ha101.htm, 3 pages, Apr. 1999.
"Mark of Excellence Award Finalist Announced," http://64.233.167.104/search?Q=cache:ciOA2YtYaBIJ:www.hometoys.com/releases/mar. . . , 6 pages, Leopard Touchscreen on p. 2, dated prior to Mar. 4, 2000, printed Aug. 20, 2004.
"Product Review—Philips Pronto Remote Control," http://hometheaterhifi.com/volume_6_2/philipsprontoremotecontrol.html, 5 pages, dated May 1999, printed Aug. 20, 2004.
"RC X10 Automation Forum: Control your Heating and Cooling System with Pronto(1/1)," http://www.remotecentral.com/cgi-bin/mboard/rc-x10/thread.cgi?12, 2 pages, dated Apr. 23, 1999, printed Aug. 20, 2004.
"Spotlight on integrated systems," Custom Builder, vol. 8, No. 2, p. 66(6), Mar.-Apr. 1993.
"Vantage Expands Controls for Audio/Video, HVAC and Security," http://www.hometoys.com/htinews/aug99/releases/vantage03.htm, 2 pages, dated Aug. 3, 1999, printed Aug. 20, 2004.
ADI, "Leopard User Manual," 93 pages, 2001.
Adicon 2500, "The Automator," 4 pages, Oct.-Dec. 2000.
ADT Security Services, "iCenter Advanced User Interface 8142ADT," Installation and Setup Guide, 4 pages, May 2001; First Sale Feb. 2001.
AED Electronics, Inc., "Presenting Climatouch the Most Innovative Thermostat in the World!," 2 pages, prior to Nov. 30, 2007.

Andrews et al., "Clicky: User-Centric Input for Active Spaces," 17 pages, Aug. 2004.
Aprilaire Electronic Thermostats Models 8344, 8346, 8348, 8363, 8365, 8366 Operating Instructions, 8 pages, 2003.
Aube Technologies, Electronic Thermostat for Heating System Model TH135-01, 5 pages, Aug. 14, 2001.
Aube Technologies, TH140-28 Electronic Programmable Thermostat, Installation Instructions and User Guide, pp. 1-4, Jan. 22, 2004.
AutomatedBuildings.com Article—"Thin Client" Solutions, "Pressure, Air Flow, Temperature, Humidity & Valves," Dwyer Instruments, Inc., 5 pages, printed Sep. 20, 2004.
Blake et al., "Seng 310 Final Project Demo Program" Illustration, 3 pages, Apr. 6, 2001.
Blake et al., "Seng 310 Final Project" Report, dated Apr. 6, 2001.
Blister Pack Insert from a Ritetemp 8082 Touch Screen Thermostat Product, 2 pages, 2002.
Braeburn Model 3000 Owner's Manual, pp. 1-13, 2001.
Braeburn Model 5000 Owner's Manual, pp. 1-17, 2001.
BRK Electronics Maximum Protection Plus Ultimate Convenience Smoke Alarm, 24 pages, Sep. 2000.
BRK First Alert, User's Manual, Smoke and Fire Alarms, pp. 1-7, Nov. 2002.
Business Wire, "MicroTouch Specialty Products Group to Capitalize on Growing Market for Low-Cost Digital Matrix Touchscreens," p. 1174 (2 pages), Jan. 6, 1999.
Cardio Manual, available at http://www.secant.ca/En/Documentation/Cardio2é-Manual.pdf, Cardio Home Automation Inc., 55 pages, printed Sep. 28, 2004.
Cardio, by Secant; http://www.hometoys.com/htinews/apr98/reviews/cardio.htm, "HTINews Review," Feb. 1998, 5 pages, printed Sep. 14, 2004.
Carrier Microelectronic Programmable Thermostat Owner's Manual, pp. 1-24, May 1994.
Carrier TSTATCCRF01 Programmable Digital Thermostat, pp. 1-21, prior to Apr. 21, 2005.
Carrier, "Edge Performance Programmable Owner's Manual," 64 pages, 2007.
Carrier, "Programmable Dual Fuel Thermostats," Installation, Start-Up & Operating Instructions, pp. 1-12, Oct. 1998.
Carrier, "Programmable Thermostats," Installation, Start-Up & Operating Instructions, pp. 1-16, Sep. 1998.
Carrier, "Standard Programmable Thermostat," Homeowner's Manual, pp. 1-8 pages, 1998.
Carrier, "Thermidistat Control," Installation, Start-Up, and Operating Instructions, pp. 1-12, Aug. 1999.
Carrier, "Comfort Programmable Owner's Manual," Carrier Touch-N-Go, Catalog No. 0M-TCPHP-4CA 60 pages, 2010.
Climatouch, User Manual, Climatouch CT03TSB Thermostat, Climatouch CT03TSHB Thermostat with Humidity Control, Outdoor UHF Temperature Transmitter 217S31, 19 pages, Printed Sep. 15, 2004.
CorAccess, "Companion 6," User Guide, pp. 1-20, Jun. 17, 2002.
Danfoss RT51/51RF & RT52/52RF User Instructions, 2 pages, Jun. 2004.
DeKoven et al., "Designing Collaboration in Consumer Products," 2 pages, 2001.
DeKoven et al., "Measuring Task Models in Designing Intelligent Products," 2 pages, Jan. 13-16, 2002.
DESA Heating Products, "Wireless Hand-Held Remote Control Sets Models (C) GHRCB and (C)GHRCTB, Operating Instructions," 4 pages, May 2003.
Domotique Secant Home Automation—Web Page, available at http://www.secant.ca/En/Company/Default.asp, 1 page, printed Sep. 28, 2004.
Emme Core User Guide, Version 1.1, 47 pages, Jan. 2011.
Firex Smoke Alarm, Ionization Models AD, ADC Photoelectric Model Pad, 4 pages, prior to Apr. 21, 2005.
Fluke, "561 HVAC Pro" Infrared Thermometer User's Manual, 22 pages, Downloaded May 24, 2012, Jan. 23, 2018.
Freudenthal et al., "Communicating Extensive Smart Home Functionality to Users of All Ages: the Design of a Mixed-Initiative Multimodal Thermostat-Interface," pp. 34-39, Mar. 12-13, 2001.

(56) References Cited

OTHER PUBLICATIONS

Gentex Corporation, HD135, 135° Fixed Temperature Heat Detector AC Pwered, 120V, 60Hz With Battery Backup, Installation Instructions—Owner's Information, pp. 1-5, Jun. 1, 1998.
Lux, "TX1500 Series Smart Temp Electronic Thermostat," Owner's Manual, 6 pages, prior to Jul. 7, 2004.
Metasys, "HVAC Pro for Windows User's Manual," 308 pages, 1998.
Mounting Template for Ritetemp Thermostat 8082, 1 page, 2002.
OMRON Electronic Components, LLC, "Micro Tilt Sensor D6B," Cat. No. B02WAD1, 2 pages, Jun. 2002.
OMRON Electronic Components, LLC, "Micro Tilt Sensor D6B," Cat. No. JB301-E3-01, 6 pages, Mar. 2005.
Operation Manual for Ritetemp Touch Screen Thermostat 8082, 8 pages, 2002.
PG&E, "SmartAC Thermostat Programming Web Site Guide," 2 pages, prior to Sep. 7, 2011.
Proliphix, "Web Enabled IP Thermostats, Intelligent HVAC Control," Proliphix Inc., 2 pages, on or before Aug. 28, 2004.
Proliphix, "Web Enabled IP Thermostats, Ultimate in Energy Efficiency!" Proliphix Inc., 2 pages, on or before Aug. 28, 2004.
Proliphix, Inc., "NT10e & NT20e," 54 pages, on or before Aug. 30, 2005.
Quick Start Guide for Ritetemp Thermostat 8082, 1 page, 2002.
Remote Control Power Requirement for Ritetemp Thermostat 8082, 1 page, 2002.
Ritetemp Operation 8029, 3 pages, Jun. 19, 2002.
Ritetemp Operation 8050, 5 pages, Jun. 26, 2002.
Ritetemp Operation 8085, pp. 1-6, prior to Apr. 21, 2005.
Saravanan et al, "Recontigurable Wireless Interface for Networking Sensors," IJCSNS International Journal of Computer Science and Network Security, vol. 8 No. 7, pp. 270-276. Revised Jul. 20, 2008.
Screenshot of http://lagotek.com/index.html?currentSection=TouchIt, Lagotek, 1 page, prior to Mar. 29, 2012.
Sealed Unit Parts Co., Inc., Supco & CTC Thermostats . . . loaded with features, designed for value!, 6 pages, prior to Apr. 21, 2005.
Sharp Corporation, "GP1S036HEZ Phototransistor Output, Transmissive Photointerrupter with Tilt Direction (4-Direction) Detecting," pp. 1-11, Oct. 3, 2005.
Totaline Model P474-1035 Owner's Manual Programmable 5-2 Day Digital Thermostat, pp. 1-21, Apr. 2003.
Totaline Star CPE230RF, Commercial Programmable Thermostat Wireless Transmitter, Owner's Manual, pp. 1-16, Oct. 1998.
Totaline Star P/N P474-0130 Non-Programmable Digital Thermostat Owner's Manual, pp. 1-22, prior to Apr. 21, 2005.
Totaline, "1 for All Programmable Digital Thermostat," Owner's Manual P/N P374-1100, 24 pages, Apr. 2001.
Totaline, "1 for All Programmable Digital Thermostat," Owner's Manual P/N P374-1100FM, 23 pages, Nov. 1998.
Totaline, "1 for All Programmable Digital Thermostat," Owner's Manual P/N P474-1050, 21 pages, Nov. 1998.
Totaline, 2001. "Intellistat Combination Temperature and Humidity Control," Owner's Manual P/N P374-1600, 25 pages, Jun. 2001.
Totaline, "P/N P374-0431 Thermostat Remote Control and Receiver," Owner's Manual, 11 pages, prior to Nov. 30, 2007.
Totaline, "P474-1100RF, P474-1100REC Wireless Thermostat," 1 page, prior to Nov. 30, 2007.
Totaline, "Programmable Thermostat Configurable for Advanced Heat Pump or Dual Fuel Operation," Owner's Manual P/N P374-1500, 24 pages, Jun. 1999.
Totaline, "Wireless Remote Sensor, Model P474-0401-1RF/REC," 2 pages, prior to Nov. 30, 2007.
Totaline, "Instructions P/N P474-1010", Manual, 2 pages, Dec. 1998.
Totaline, "Programmable Thermostat", Homeowner's Guide, 27 pages, Dec. 1998.
Totaline, "Wireless Programmable Digital Thermostat," Owner's Manual 474-1100RF, 22 pages, 2000.
Trane, "System Programming, Tracer Summit Version 14, BMTW-SVP01D-EN," 623 pages, 2002.
Trane, "Wireless Zone Sensor. Where Will Wireless Technology Take You?," 4 pages, Feb. 2006.
Travis Industries, Remote Fireplace Thermostat, Part #99300651, 6 pages, printed Feb. 3, 2003.
Trouble Shooting Guide for Ritetemp Thermostat 8082, 1 page, 2002.
Visor Handheld User Guide, 280 pages, Copyright 1999-2000.
Warmly Yours, "Model TH111GFCI-P (120 VAC)," Manual, pp. 1-4, prior to Jul. 7, 2004.
White-Rodgers 1F80-224 Programmable Electronic Digital Thermostat, Installation and Operation Instructions, 8 pages, prior to Apr. 21, 2005.
White-Rodgers Comfort-Set III Thermostat, pp. 1-44, prior to Jul. 7, 2004.
White-Rodgers Installation Instructions for Heating & Air Conditioning IF78 5/2 Day Programmable Thermostat, 7 pages, prior to Jul. 7, 2004.
White-Rodgers Installation Instructions for Heating & Air Conditioning IF78 Non-Programmable Thermostat, 6 pages, prior to Apr. 21, 2005.
White-Rodgers, "Installation Instructions for Heating & Air Conditioning IF72 5/2 Day Programmable Heat Pump Thermostat," 8 pages, prior to Jul. 7, 2004.
White-Rodgers, "Comfort-Set 90 Series Thermostat," Manual, pp. 1-24, prior to Jul. 7, 2004.
White-Rodgers, 1F80-240 "(for Heating Only systems) Programmable Electronic Digital Thermostat," Installation and Operation Instructions, 8 pages, prior to Jul. 7, 2004.
White-Rodgers, 1F80-241 "Programmable Electronic Digital Thermostat," Installation and Operation Instructions, 6 pages, prior to Jul. 7, 2004.
White-Rodgers, 1F80-261 "Programmable Electronic Digital Thermostat," Installation and Operation Instructions, 8 pages, prior to Jul. 7, 2004.
White-Rodgers, 1F81-261 "Programmable Electronic Digital Multi-Stage Thermostat," Installation and Operation Instructions, 8 pages, prior to Jul. 7, 2004.
White-Rodgers, 1F82-261 "Programmable Electronic Digital Heat Pump Thermostat," Installation and Operation Instructions, 8 pages, prior to Jul. 7, 2004.

* cited by examiner

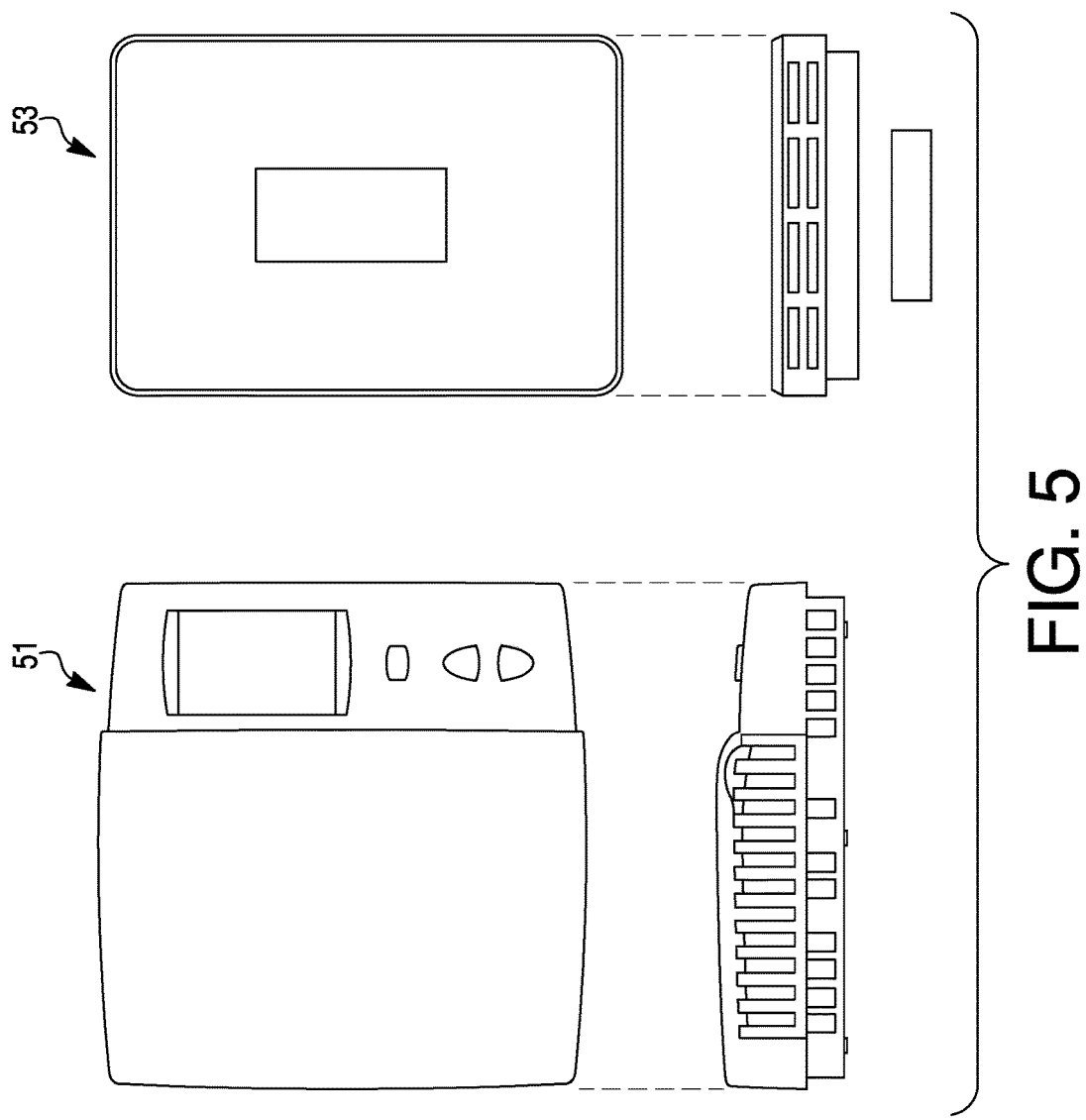

MULTIPLE HEATSINK COOLING SYSTEM
FOR A LINE VOLTAGE THERMOSTAT

This application is a Continuation of U.S. patent application Ser. No. 14/329,357, filed Jul. 11, 2014, and entitled, "Multiple Heatsink Cooling System for a Line Voltage Thermostat". U.S. patent application Ser. No. 14/329,357, filed Jul. 11, 2014, is hereby incorporated by reference.

BACKGROUND

The present disclosure pertains to switches and particularly to heatsinks associated with the switches. More particularly, the disclosure pertains to switches for thermostats.

SUMMARY

The disclosure reveals a line voltage thermostat having a multiple heatsink switch. A total switch may have a semiconductor switch mounted on each heatsink of the multiple heatsink switch. The semiconductor switches of the respective heatsinks may be connected in parallel to represent the total switch. Each of the two or more heatsinks, having a semiconductor switch for switching, and in total conveying the same power as one equivalent switch with one total heatsink, may have higher maximum operating temperatures and higher thermal resistances than twice the thermal resistance of the one total heatsink. The two or more heatsinks may be situated within a housing of the line voltage thermostat, and be easier to distribute in the housing to achieve an efficient layout of a display and control buttons for the thermostat.

BRIEF DESCRIPTION OF THE DRAWING

FIG. 5 is a diagram of housings of a commercial thermostat and a two heatsink configuration for illustrating a size, display and layout comparison.

DESCRIPTION

Figure 1:
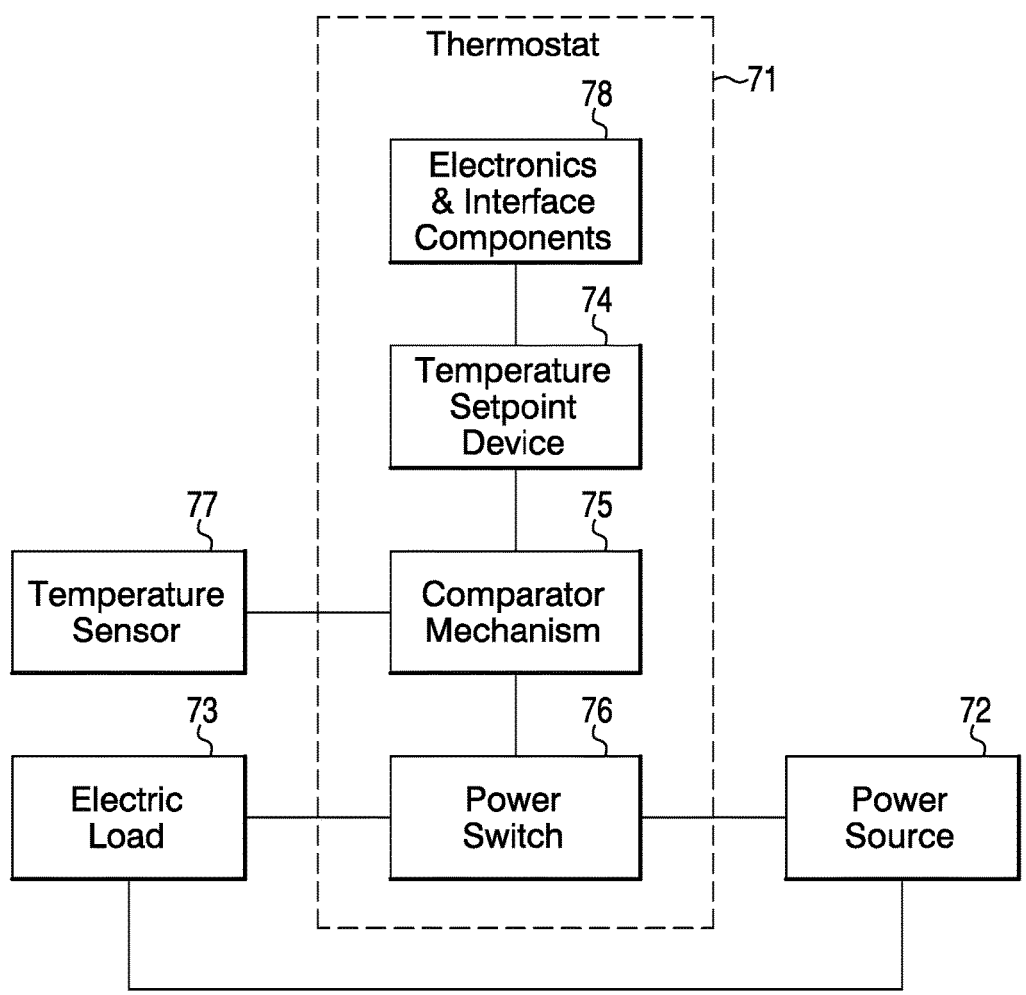
FIG. 1 is a diagram of an illustrative thermostat, a power source and an electric load.

The present system and approach may incorporate one or more processors, computers, controllers, user interfaces, wireless and/or wire connections, and/or the like, in an implementation described and/or shown herein.

This description may provide one or more illustrative and specific examples or ways of implementing the present system and approach. There may be numerous other examples or ways of implementing the system and approach.

Line voltage thermostats may be used to direct control of an electrical heater. High electrical power going through the switching component in the thermostat produces excessive heat that may damage the component itself. A single heatsink may be traditionally used in order to cool down the switching component.

Often, a heat sink may take up to two-thirds of a thermostat envelope and create many integration constraints. Such thermostat arrangement may have a bulky size, a limited screen size, limited positions of the screen due to a heat source location, and limited positions for button locations.

The present arrangement may incorporate two separate switching components such as triacs or SCRs (e.g., thyristors) and have each component installed with its own heat sink in the envelope. The arrangement may permit each switching component to run at a higher tab temperature since it has half of the original power going through it while having the same junction temperature as the single component arrangement. The arrangement may incorporate more than two components and corresponding heat sinks.

The thermal performance of a heat sink may be a non-linear function of the heat sink's overall size. Heat sinks of smaller size may be more efficient.

In order for the present arrangement operate at its best in an envelope, both heat sinks should be the furthest apart from each other. Advantages of the present arrangement compared to a single switching component envelope, for instance that of a thermostat, may incorporate a smaller overall product and better aesthetics, or (if envelope size is kept constant) a higher power rating. The arrangement may result in a better integration of screen such as a more favorable centering the screen and yet keeping it far from a heat source, a possibility of larger screen, and a centering of the buttons.

The present arrangement may be used to improve the aesthetics of a product such as the thermostat by reducing its size or increasing its power rating without reducing its size. The arrangement may provide more flexibility for human machine interface components integration such as a screen and buttons. A new thermostat look and/or higher power rating may create a significantly competitive advantage in the market.

RF/heatsink compatibility (RF mechanical specifications) and RF maximum temperature requirements (RF thermal specifications) may be a consideration with the present arrangement. A printed circuit board (PCB) thermal model may incorporate dissipated power from other electronic components other than the triac, thermal resistance of the power traces, a position of a compensation sensor, and ambient sensor thermal cooling and position.

Factors of concern may incorporate sizes and positions of electronic components, a position of compensation sensor, ambient sensor thermal cooling and position, high temperature LCD and backlight, and thermophoresis (black soot deposition).

FIG. 1 is a diagram of an illustrative thermostat 71, a power supply or source 72 and an electric load 73. Thermostat 71 may incorporate a temperature setpoint mechanism or device 74, a device, microcontroller or mechanism 75 having a comparator function, and a power switch 76. The comparator function may be performed by an electronic or mechanical device, mechanism, or by a microcontroller. Thermostat 71 may be connected to a temperature sensor 77. Temperature sensor 77 may be in thermostat 71 or remote from thermostat 71. Power supply 72 may be connected to a power switch or switching component 76 of thermostat 71. An electric load 73 may be connected to power switch 76 and power supply 72. Electric load 73 may be a heater. Temperature sensor 77 and electric load 73 may be situated in the same area or space. Temperature indications from temperature setpoint device 74 and temperature sensor 77 may go to comparator function of a mechanism 75. Mechanism 75 with a comparator function may determine from the indications whether power switch 76 should be closed or not, relative to connecting electric load or heater 73 to power supply 72.

Power in a room may be controlled by a duty cycle on the full power to the electric load or heater 73: time on/(time on+time off). For example, 7.5 seconds on and 7.5 seconds off every 15 seconds on a 1000 W baseboard heater may be 50 percent of 1000 W=500 W of power delivered.

Thermostat 71 may also incorporate additional electronics and interface components 78 that may be connected with one or more components inside and outside of the diagram in FIG. 1. Electronics and interface components 78 may provide various functions of calculation, processing and power control of thermostat system 71.

Figure 2:
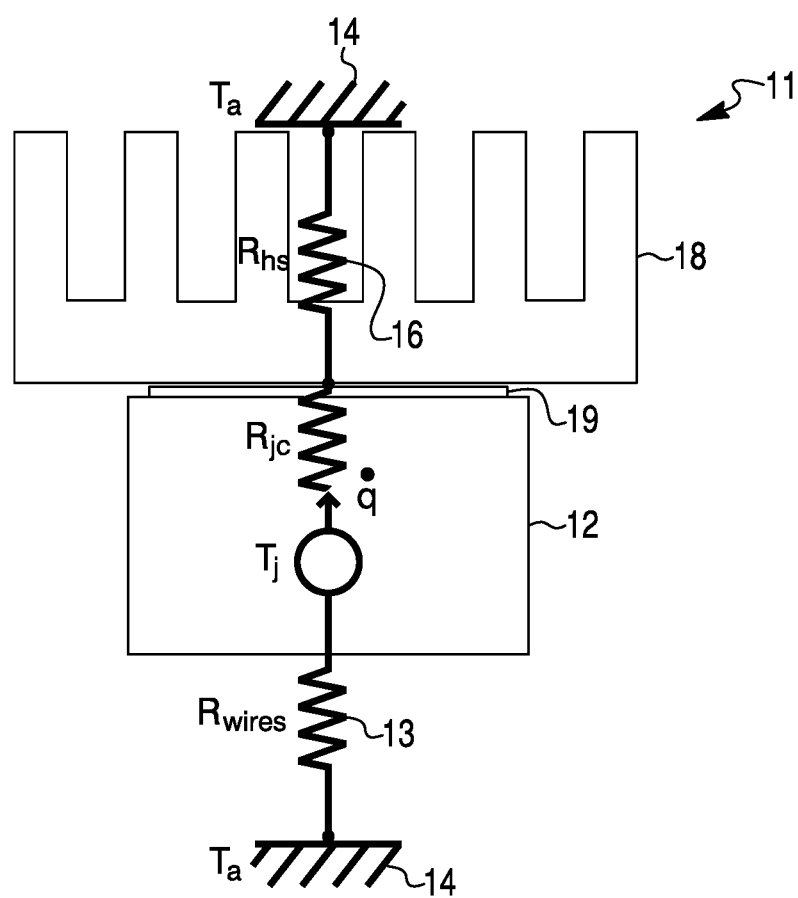
FIG. 2 is a diagram of thermal conductivity of an example triac arrangement.

FIG. 2 is a diagram of a thermal conductivity of an example triac arrangement 11. A triac 12 may be connected to the ambient air 14 via wires, PCB and thermostat structure, and represented by the thermal resistance 13 (Rwires). The other side of triac 12 may be connected to the ambient air 14 via a flat surface heatsink 18 with a conductive adhesive or other material 19, and represented by the thermal resistance 16 (Rhs).

Figure 3:
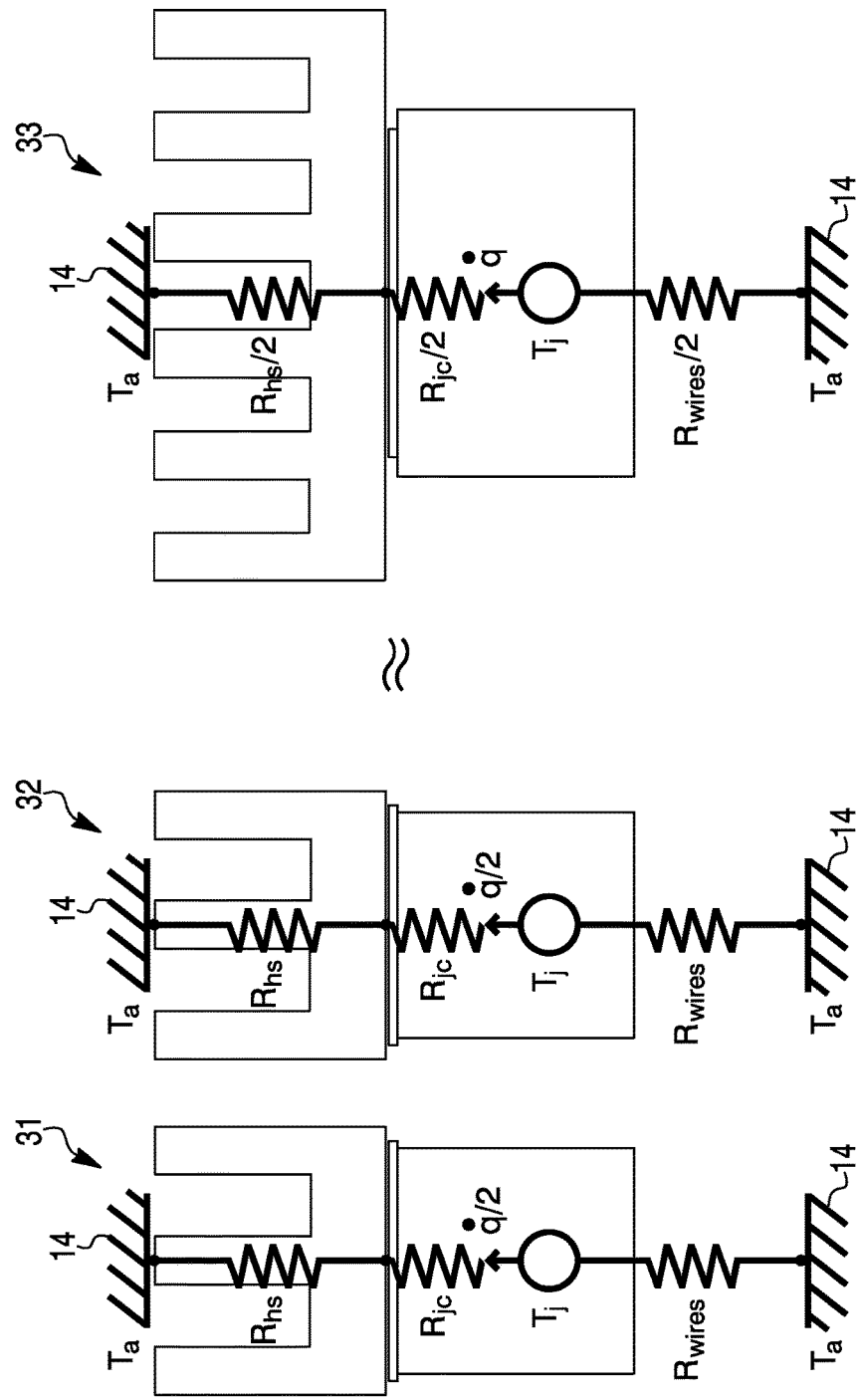
FIG. 3 is a diagram that illustrates a two-heatsink principle with an example layout of two SCR/triac and respective heatsink assemblies

FIG. 3 is a diagram that illustrates a two-heatsink principle with an example layout of two SCR/triac and respective heatsink assemblies 31 and 32. An approximation or equivalent of the SCR assemblies may be shown in terms of one triac assembly 33. For the same total "q" (energy) of assemblies 31 and 32 together being the same for the single triac assembly 33, the thermal resistance of the junction the triac (Rjc), heatsink (Rhs), and connecting wires (Rwires) may be about one-half for assembly 33 of that for an SCR assembly.

Advantages of a two or more SCR/triac arrangement may incorporate that each SCR/triac may operate at a higher temperature and its heatsink may be smaller than a single triac arrangement. For instance, the triac maximum tab temperature may be indicated by the formula Tj−Rjc*P=104−0.97*17.5=87° C. The double triac/SCRs maximum tab temperature may be indicated by the formula Tj−Rjc*P=104−1*17.5/2=95° C. A smaller heatsink of a SCR or triac of a double arrangement may equate to a higher thermal resistance heatsink than twice the thermal resistance of a single triac.

Heatsink thermal resistance for a triac may be indicated by the formula Rth=(Tc−Ta)/P=(87−25)/17.5=3.54° C./W; twice that value is 7.08° C./W. The mass for the triac arrangement may be 90 g. Heatsink thermal resistance for a double triac/SCR arrangement may be indicated by the formula Rth=(Tc−Ta)/P=(95−25)/8.75=8° C./W. The mass for the double arrangement may be 30 g; twice that value is 60 g.

Figure 4A:
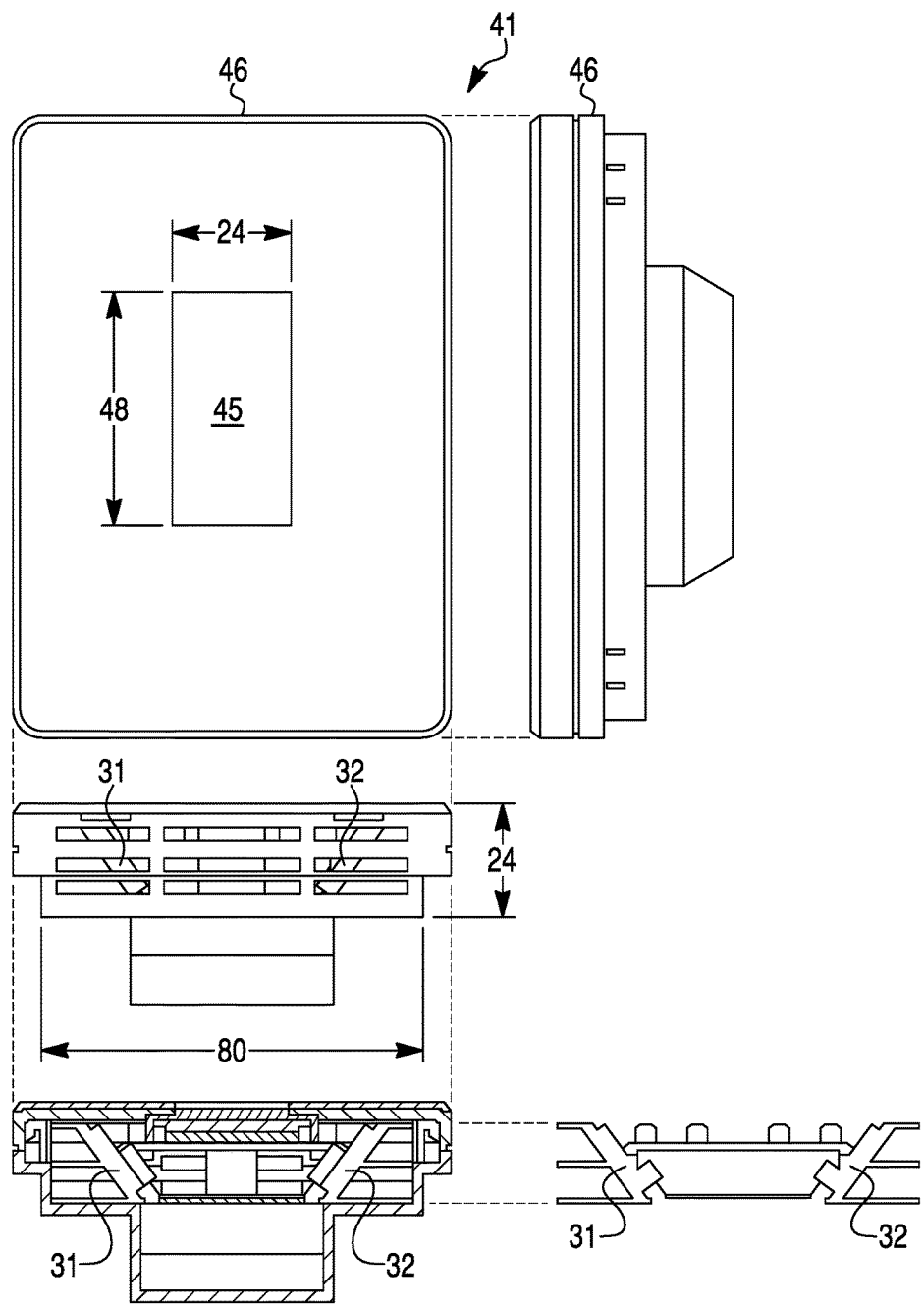
FIG. 4a is a diagram of layout of a housing design that indicates an integration of the double SCR/triac arrangement in a product rather than a single triac arrangement.
Figure 4B:
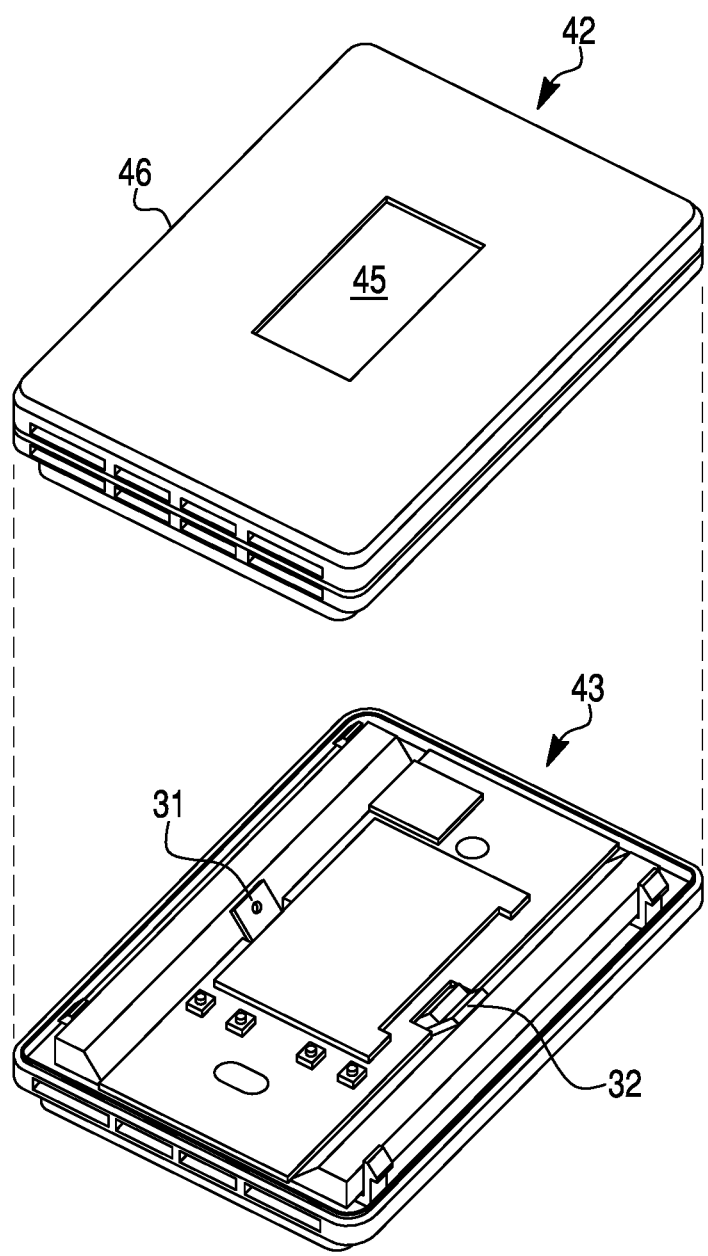
FIG. 4b is a diagram of some layouts of a housing design.

FIG. 4a is a diagram of layout 41 of a housing 46 design that may indicate a better integration of the double SCR/triac arrangement in a product than a single triac arrangement. FIG. 4b is a diagram of layouts 42 and 43 of housing design 46. A placement of the two SCR/triac and heatsink assemblies 31 and 32 are revealed in layouts 41 and 43. Advantages of the design may incorporate a centered LCD 45 as shown in layouts 41 and 42. Display 45 may instead be of a non-LCD technology. Display 45 may have dimensions of 24 mm×48 mm. Other dimensions of components in housing 46 may incorporate a PCB area of 8500 mm$^2$ (for comparison, see a Honeywell TH104 PCB=5100 mm$^2$), with no wall plate required (a cost saving), a slim structure with a vertical concept (34 mm), straight fins, and a 50 percent aluminum weight reduction, as compared with the OEM637 noted herein.

FIG. 5 is a diagram of housings of a Honeywell TH104 thermostat 51 and a two heatsink configuration for illustrating a size, display and layout comparison.

Figure 6:
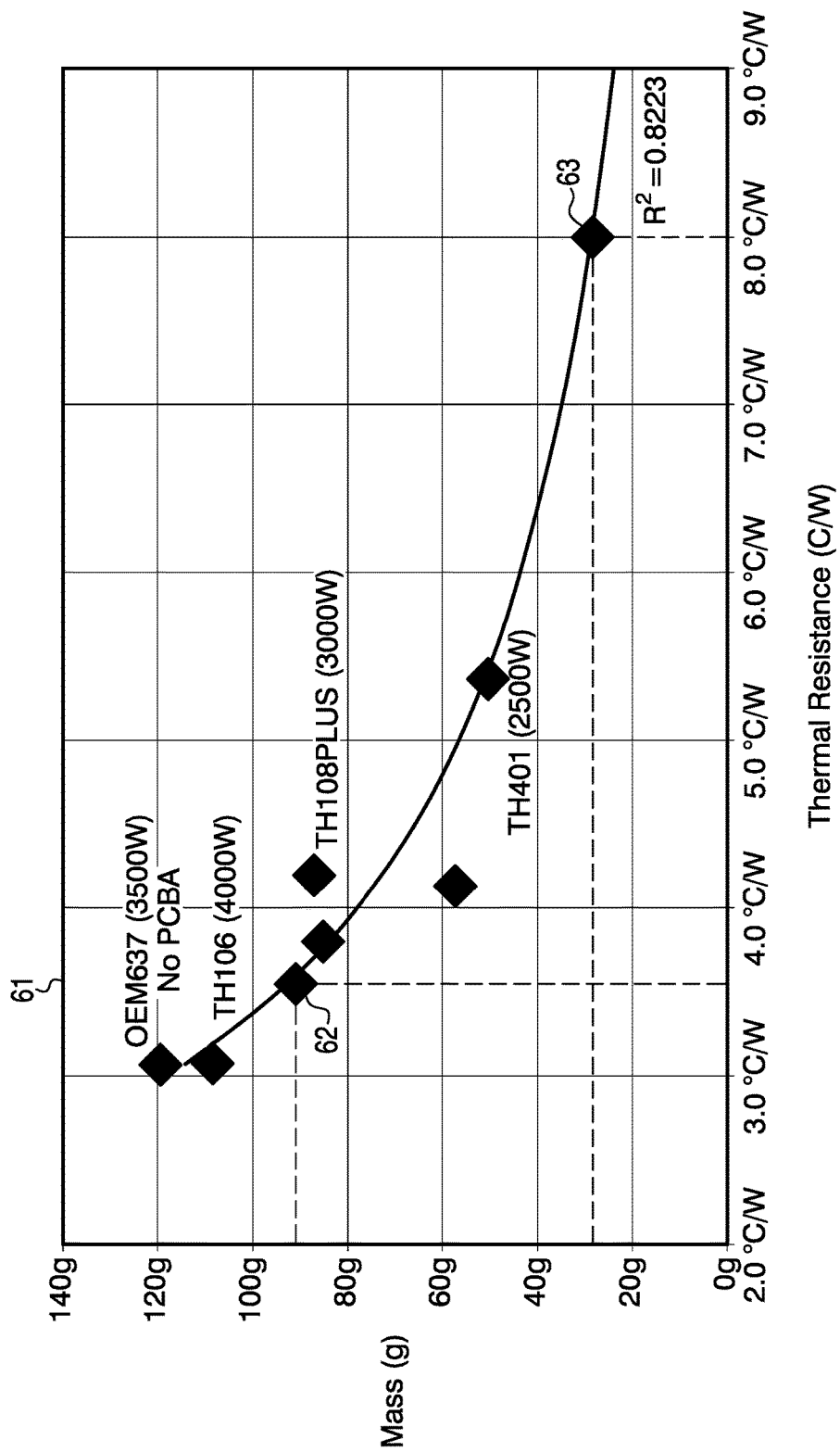
FIG. 6 is a diagram of a graph that shows a non-linear relationship between mass and thermal resistance for various models of thermostats.

FIG. 6 is a diagram of a graph 61 that shows a non-linear relationship between mass and thermal resistance for various models of thermostats. Point 62 represents the calculation for the triac and point 63 represents the calculation for each SCR noted herein.

To recap, a thermostat for controlling an electric heater may incorporate an ambient temperature sensor, a temperature setpoint device, a comparator mechanism connected to the ambient temperature sensor and the temperature setpoint device, and a power switch having a control terminal connected to the comparator mechanism. The power switch may incorporate two or more separate heatsinks and a solid state switch situated on each heatsink. Each solid state switch may have a control input connected to the control terminal of the power switch.

The thermostat may further incorporate a housing. The temperature setpoint device, the comparator mechanism and the power switch may be situated in the housing.

The ambient temperature sensor may be for indicating a temperature of a space containing an electric heater connected to the power switch, and for providing an output signal to the control terminal of the power switch or no output signal to the control terminal of the power switch.

The comparator mechanism may compare a first temperature indication from the ambient temperature sensor and a second temperature indication from the temperature setpoint device and provide a first output signal, a second output signal or no output signal to the control terminal of the power switch. The first output signal may indicate that the second temperature indication is X degrees greater than the first temperature indication. The second output signal may indicate that the first temperature indication is Y degrees greater than the second temperature indication. X may be a predetermined number. Y may be a predetermined number.

The first output signal may turn on the power switch. The second output signal may turn off the power switch. When the power switch is turned off, the electric heater may be disconnected from electric power. When the power switch is turned on, the electric heater may be connected to electric power.

The solid state switch may be selected from a group consisting of an SCR and a triac.

Each heatsink and corresponding solid state switch may be placed in the housing at a distance from any other heatsink. The distance may be set at a maximum within the housing.

An approach, for controlling an electric load, may incorporate providing a thermostat having a power switch connectable to an electric load, determining how much power is to be delivered by an electric load, designating an amount of time the electric load is to be powered, and designing a power switch capable of turning on and off the power of an electric load, having two or more solid state switches connected in parallel and attached to separate heatsinks. Each of the two or more solid state switches may be capable of turning on and off the power of the electric load.

The approach may further incorporate measuring a temperature of a space having a temperature to be controlled, selecting a desired temperature to be provided to the space, and connecting the electric load to power with the power switch if the temperature of the space is less than the desired temperature. The electric load may provide heat in the space to raise the temperature in the space when the electric load is connected to the power.

The measuring the temperature in the space, selecting the desired temperature, and providing a signal to the power switch to connect the electric load to power may be performed by a temperature sensor, a temperature setpoint device, and a comparator mechanism, respectively.

The temperature setpoint device, the comparator mechanism and the power switch may be contained within a housing. The housing may have a thermostat that incorporates the temperature sensor, the temperature setpoint device, and the comparator mechanism.

A heatsink cooling system for a line voltage thermostat may incorporate a switching component and a thermostatic control. The switching component may incorporate two or more heatsinks, and a semiconductor switch situated on each of the two or more heatsinks. Each semiconductor switch may have an input connectable to a line voltage and an output connectable to an electric load, and have a control terminal. The thermostatic control may have an output connected to the control terminal of each semiconductor switch.

The thermostatic control may incorporate a housing, a temperature sensor, a temperature setpoint mechanism, and an electronics module connected to the temperature sensor, the temperature setpoint mechanism, and the output of the thermostatic control.

The temperature setpoint mechanism may be accessible on the housing or be remote from the housing. The electronic module may be situated in the housing. The switching component may be situated in the housing.

The two or more heatsinks may be situated in the housing at a maximum distance from one another within the housing.

Increasing a number of heatsinks with the switching component having a semiconductor switch situated on each heatsink of a number of heatsinks greater than one, may increase a maximum operating tab temperature for each semiconductor switch and result in each of the more than one heatsinks having a thermal resistance greater than a heatsink of a switching component if the switching component has a total of one semiconductor switch situated on just one heatsink for the same amount electric load carried by the switching component having two or more semiconductor switches with each semiconductor switch having at least one heatsink. The semiconductor switch may be selected from a group consisting of a SCR and a triac.

The electric load may incorporate an electric heater in a space having a temperature that can be measured by the temperature sensor.

The mass of the two or more heatsinks of the switching component having two or more semiconductor switches may be less than the mass of a heatsink of the switching component having just one semiconductor switch on one heatsink for the same electrical load.

In the present specification, some of the matter may be of a hypothetical or prophetic nature although stated in another manner or tense.

Although the present system and/or approach has been described with respect to at least one illustrative example, many variations and modifications will become apparent to those skilled in the art upon reading the specification. It is therefore the intention that the appended claims be interpreted as broadly as possible in view of the related art to include all such variations and modifications.

What is claimed is:

1. A thermostat for controlling an electric heater comprising:
   a housing;
   a display positioned in the housing;
   a temperature setpoint device disposed within the housing;
   an ambient temperature sensor;
   a comparator mechanism disposed within the housing, the comparator mechanism having an input connected to the ambient temperature sensor and the temperature setpoint device and configured to receive temperature indications from the ambient temperature sensor and the temperature setpoint device and determine to connect and disconnect the electric heater from a power source based on the received temperature indications;
   a power switch positioned within the housing, the power switch having a control terminal connected to an output of the comparator mechanism allowing the comparator mechanism to open and close the power switch in response to the comparator mechanism determining to connect and disconnect the electric heater from the power source; and
   wherein the power switch comprises:
   two or more separate heatsinks;
   a solid state switch situated on each heatsink; and
   wherein the solid state switches are connected in parallel to one another and connected to the control terminal allowing the comparator mechanism to open and close each solid state switch.

2. The thermostat of claim 1, wherein the ambient temperature sensor is for indicating a temperature of a space containing the electric heater connected to the power switch, and for providing an output signal to the control terminal of the power switch or no output signal to the control terminal of the power switch.

3. The thermostat of claim 1, wherein:
   the received temperature indications include a first temperature indication from the ambient temperature sensor and a second temperature indication from the temperature setpoint device and the comparator mechanism compares the first temperature indication from the ambient temperature sensor and the second temperature indication from the temperature setpoint device and provides a first output signal, a second output signal or the comparator mechanism does not provide an output signal to the control terminal of the power switch;
   the first output signal indicates that the second temperature indication is X degrees greater than the first temperature indication;
   the second output signal indicates that the first temperature indication is Y degrees greater than the second temperature indication;
   no output signal is provided when the second temperature indication is not X degrees greater than the first temperature indication and the first temperature indication is not Y degrees greater than the second temperature indication;
   X is a predetermined number; and
   Y is a predetermined number.

4. The thermostat of claim 3, wherein:
   the first output signal turns on the power switch;
   the second output signal turns off the power switch; and
   no output signal leaves the power switch at its current state.

5. The thermostat of claim 4, wherein:
when the power switch is turned off, the electric heater is disconnected from the power source; and
when the power switch is turned on, the electric heater is connected to the power source.

6. The thermostat of claim 1, wherein the solid state switch is selected from a group consisting of an SCR and a triac.

7. The thermostat of claim 1, wherein:
each heatsink and a corresponding solid state switch are placed in the housing at a distance from any other heatsink; and
the distance is set at a maximum within the housing.

8. A thermostat for controlling an electric heater comprising:
a housing;
a display positioned in the housing;
a temperature setpoint device disposed within the housing;
an ambient temperature sensor;
a comparator mechanism disposed within the housing, the comparator mechanism having an input connected to the ambient temperature sensor and the temperature setpoint device and configured to receive temperature indications from the ambient temperature sensor and the temperature setpoint device and determine to connect and disconnect the electric heater from a power source based on the received temperature indications;
a power switch positioned within the housing, the power switch having a control terminal connected to an output of the comparator mechanism allowing the comparator mechanism to open and close the power switch in response to the comparator mechanism determining to connect and disconnect the electric heater from the power source; and
wherein the power switch comprises:
a first heatsink having a first solid state switch situated thereon, the first heatsink positioned at a first location within the housing;
a second heatsink having a second solid state switch situated thereon, the second heatsink positioned at a second location within the housing, the second location positioned a maximum distance from the first location; and
wherein the solid state switches are connected in parallel to one another and connected to the control terminal allowing the comparator mechanism to open and close each solid state switch.

9. The thermostat of claim 8, wherein the ambient temperature sensor is for indicating a temperature of a space containing the electric heater connected to the power switch, and for providing an output signal to the control terminal of the power switch or no output signal to the control terminal of the power switch.

10. The thermostat of claim 8, wherein:
the received temperature indications include a first temperature indication from the ambient temperature sensor and a second temperature indication from the temperature setpoint device and the comparator mechanism compares the first temperature indication from the ambient temperature sensor and the second temperature indication from the temperature setpoint device and provides a first output signal, a second output signal or the comparator mechanism does not provide an output signal to the control terminal of the power switch;
the first output signal indicates that the second temperature indication is X degrees greater than the first temperature indication;
the second output signal indicates that the first temperature indication is Y degrees greater than the second temperature indication;
no output signal is provided when the second temperature indication is not X degrees greater than the first temperature indication and the first temperature indication is not Y degrees greater than the second temperature indication;
X is a predetermined number; and
Y is a predetermined number.

11. The thermostat of claim 10, wherein:
the first output signal turns on the power switch;
the second output signal turns off the power switch; and
no output signal leaves the power switch at its current state.

12. The thermostat of claim 11 wherein:
when the power switch is turned off, the electric heater is disconnected from the power source; and
when the power switch is turned on, the electric heater is connected to the power source.

13. A heatsink cooling system for a line voltage thermostat comprising:
a switching component having a control terminal and comprising two or more heat-sinks connected in parallel, each heat-sink including a semiconductor switch situated thereon, wherein the parallel arrangement causes a decrease in power supplied to each semiconductor switch allowing the switching component to operate at an increased temperature; and
a thermostatic control having an output; and
a comparator mechanism having an input connected to the output of the thermostatic control and having an output connected to the control terminal of the switching, the comparator mechanism configured to compare a first temperature indication from an ambient temperature sensor and a second temperature indication from the thermostatic control and to provide a first output signal, a second output signal or does not provide an output signal to the switching component via the control terminal;
wherein:
each semiconductor switch has an input connectable to a line voltage and an output connectable to an electric load, and a connection to the control terminal.

14. The system of claim 13, wherein the thermostatic control comprises:
a housing;
a display;
a temperature sensor;
a temperature setpoint mechanism; and
an electronics module connected to the temperature sensor, the temperature setpoint mechanism, and the output of the thermostatic control.

15. The system of claim 14, wherein:
the temperature setpoint mechanism is accessible on the housing or is remote from the housing;
the electronics module is situated in the housing; and
the switching component is situated in the housing.

16. The system of claim 14, wherein the two or more heatsinks are situated in the housing at a maximum distance from one another within the housing.

17. The system of claim 14, wherein the electric load comprises an electric heater in a space having a temperature that can be measured by the temperature sensor.

18. The system of claim 13, wherein each semiconductor switch is selected from a group consisting of a SCR and a triac.

19. The system of claim 13, wherein a mass of the two or more heatsinks of the switching component having two or more semiconductor switches is less than a mass of a heatsink of the switching component having just one semiconductor switch on one heatsink for the same electrical load.

20. The system of claim 13, wherein the two or more heatsinks connected in the parallel arrangement allows the switching component to be comprised of a plurality of smaller heatsinks resulting in each of the two or more heatsinks having a thermal resistance greater than a heatsink of a switching component having a total of one semiconductor switch situated on just one heatsink, when each switching component is carrying a same amount of electric load.

\* \* \* \* \*